(12) United States Patent
Cattaneo et al.

(10) Patent No.: US 11,139,813 B1
(45) Date of Patent: Oct. 5, 2021

(54) RF-SWITCH WITH ENHANCED VOLTAGE ROBUSTNESS

(71) Applicant: Infineon Technologies AG, Neubiberg (DE)

(72) Inventors: Andrea Cattaneo, Taufkirchen (DE); Valentyn Solomko, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/028,452

(22) Filed: Sep. 22, 2020

(51) Int. Cl.
*H03K 3/012* (2006.01)
*H03K 17/16* (2006.01)
*H03K 17/687* (2006.01)

(52) U.S. Cl.
CPC ................... *H03K 17/687* (2013.01)

(58) Field of Classification Search
None
See application file for complete search history.

(56) References Cited

U.S. PATENT DOCUMENTS

| | | | |
|---|---|---|---|
| 8,786,002 B2* | 7/2014 | Kondo | H04B 1/48 257/312 |
| 9,742,400 B2 | 8/2017 | Bakalski et al. | |
| 10,277,222 B1* | 4/2019 | Maxim | H03K 17/161 |
| 10,374,595 B1 | 8/2019 | Bakalski | |
| 10,680,599 B1 | 6/2020 | Syroiezhin et al. | |
| 10,715,133 B1* | 7/2020 | Scott | H03K 17/161 |
| 2014/0266425 A1 | 9/2014 | Ashworth et al. | |
| 2017/0244402 A1 | 8/2017 | Bolton et al. | |
| 2020/0028504 A1 | 1/2020 | Solomko et al. | |

* cited by examiner

*Primary Examiner* — Kenneth B Wells
(74) *Attorney, Agent, or Firm* — Slater Matsil, LLP

(57) ABSTRACT

An RF switch includes serially coupled RF cells coupled between a first switch node and a second switch node, wherein each of the serially coupled RF cells include at least one transistor; and a varactor circuit coupled to at least one node of a transistor in an RF cell, and coupled between the RF cell and an adjacent RF cell, wherein the varactor circuit is configured for equalizing a voltage of the RF cell and a voltage of the adjacent RF cell during an off mode of the RF switch.

28 Claims, 11 Drawing Sheets

RF-SWITCH WITH ENHANCED VOLTAGE ROBUSTNESS

TECHNICAL FIELD

The present invention relates generally to an RF switch with enhanced voltage robustness and a corresponding method.

BACKGROUND

State-of-the art RF (Radio Frequency) switches are typically realized with a plurality of serially-connected transistors. Generally, these serially-connected transistors can be realized as n-type MOSFET (Metal Oxide Semiconductor Field Effect Transistors) transistors fabricated in a SOI (Silicon on Insulator) substrate, or in a bulk silicon substrate. A single transistor used as an RF switch generally has low voltage handling capabilities, especially when the RF switch operates in a closed (OFF) configuration. High RF-voltage peaks impressed across the RF switch could lead to the creation of an unwanted conductive path between the terminals of the RF switch in the OFF configuration.

In order to realize RF switches capable of handling larger RF voltage swings the stacking approach is widely used, wherein a plurality of serially-connected transistors are substituted for a single transistor in the RF switch. A plurality of serially-connected transistors is stacked in order to equally distribute the total voltage across the RF switch and to reduce the corresponding voltage drop across each individual transistor. This stacking approach can lead to the realization of RF switches with n-type MOSFET transistors that can safely handle a voltage across the RF switch in excess of boy or even in excess of 50-60V without the creation of an unwanted conductive path in the OFF configuration.

Nevertheless, losses in the substrate tend to induce an unequal voltage distribution among the serially-connected transistors, also known as an unbalance. The transistors in a first group of transistors closer to an RF voltage source experience a higher voltage drop and gradually the voltage drop is reduced for the transistors in a second group of transistors further away from the RF voltage source. This unbalance limits the overall voltage handling capability of the RF switch when a transistor in the first group of transistor reaches a maximum voltage rating; the whole transistor chain of serially-connected transistors then creates an undesirable conductive path in the OFF mode of operation. The unbalance phenomenon generally limits the voltage handling capability of a highly stacked RF switch to less than 50-60V. Any further increase in the number of stacked transistor (for example, greater than twenty serially-connected transistors) is ineffective since the added transistors in the chain of serially-connected transistors do not significantly contribute to reduce the voltage drop across the transistors in the first group of transistors.

SUMMARY

In an embodiment, an RF switch includes a plurality of serially coupled RF cells coupled between a first switch node and a second switch node, wherein each of the serially coupled RF cells include at least one transistor; and a varactor circuit coupled to at least one node of a transistor in an RF cell, and coupled between the RF cell and an adjacent RF cell, wherein the varactor circuit is configured for equalizing a voltage of the RF cell and a voltage of the adjacent RF cell during an off mode of the RF switch.

In an embodiment, a method of operating an RF switch including a plurality of serially coupled RF cells includes sensing a differential voltage between a gate node and a body node of a transistor in an RF cell; and when a voltage difference between the gate node voltage and the body node voltage is greater than a first threshold, activating a varactor circuit coupled between the RF cell and an adjacent RF cell.

In an embodiment, an RF switch includes a first plurality of serially coupled RF cells coupled between a first switch node and a second switch node, wherein each of the serially coupled RF cells comprise at least one transistor; and a second plurality of varactor circuits, each varactor circuit of the second plurality of varactor circuits being coupled between corresponding adjacent RF cells of the first plurality of serially coupled RF cells, wherein each varactor circuit is coupled to a gate node and to a body node of one of the corresponding adjacent RF cells of the first plurality of serially coupled RF cells, wherein the second plurality of varactor circuits comprises weighted layout areas.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In various embodiments, an RF switch includes a plurality of series connected RF switching transistors and additional voltage equalization circuitry. At higher applied RF voltages, the equalization circuitry equalizes the voltages across one of more of the RF switching transistors. This advantageously provides overvoltage protection of the RF switch at higher applied RF voltages, while allowing for smaller parasitic capacitances at lower applied RF voltages. In various example embodiments, the voltage equalization circuit includes one or more varactors and other circuit components. An RF voltage equalization circuit is coupled to adjacent RF switching transistors of the RF switch. For a total of "N+1" RF switching transistors, "N" corresponding RF equalization circuits are provided for equalizing the RF voltages of each of the RF switching transistors, in an embodiment. In other embodiments, fewer than "N" RF equalization circuits can be used, and not all of the RF switching transistor pairs need to be equalized. Other configurations of connecting the RF switching transistors and RF equalization circuits can be used wherein some of the RF equalization circuits are selectively omitted.

Figure 1A:
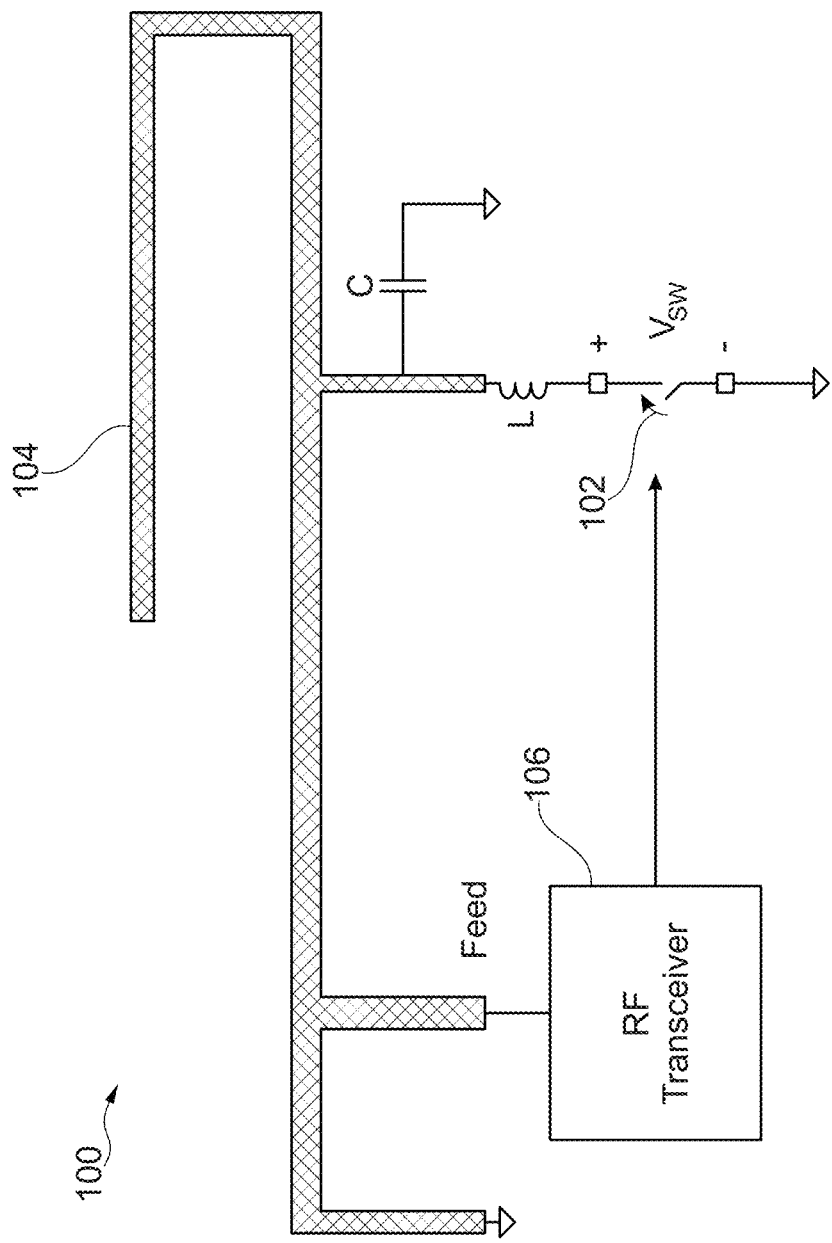
FIG. 1A illustrates an exemplary RF system including an RF switch.

FIG. 1A illustrates an exemplary RF system 100 in which an RF transceiver 106 is coupled to a feed line of an Inverted F (IFA) antenna 104 such as may be used in a mobile RF system such as a mobile phone. In addition to RF transceiver 106, antenna aperture tuning shunt switch 102 is coupled to antenna 104 and capacitor C via inductor L to provide tuning to antenna 104. In the illustrated example, only a single shunt RF switch 102 is shown. However, in various embodiments, multiple switches may be used in conjunction with other passive devices to provide tuning to antenna 104.

During operation of RF system 100, voltage $V_{SW}$ across switch 102 may experience very high voltage swings due to the resonant nature of antenna 104 and its immediate electrical environment. In fact, in some systems, switch voltage $V_{SW}$ may experience RF voltages of about 80 V when RF transceiver 106 transmits 33 dBm of power and RF switch 102 is open. Accordingly, various measures are taken in the design of switch 102 to withstand such high voltages as will be described in further detail below.

Figure 1B:
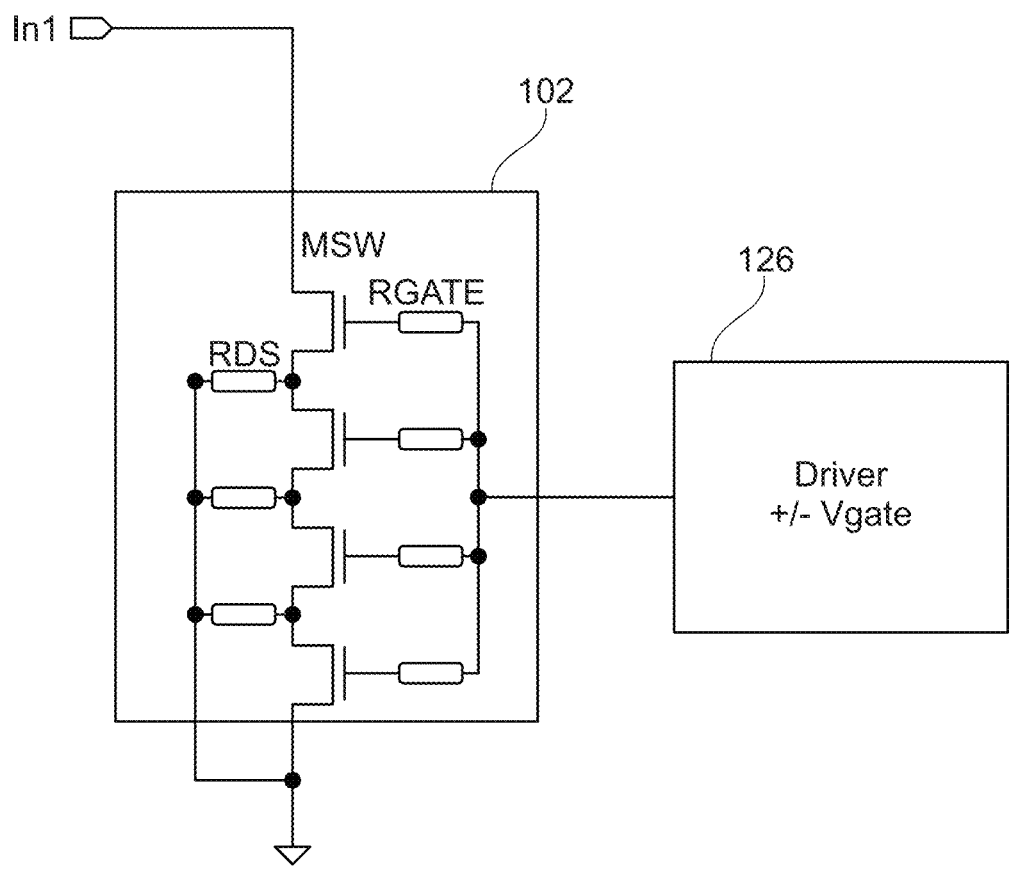
FIG. 1B illustrates a detailed view of the RF switch and a driver of the exemplary RF system of FIG. 1A.

FIG. 1B illustrates a detailed view of shunt RF switch 102 and driver 126. As shown, shunt RF switch 102 is implemented using a plurality of stacked transistors that are series connected, each transistor MSW of which has a series gate resistor RGATE in a biasing arrangement. Such stacking is used, for example, to prevent breakdown in the presence of high RF voltage swings. As is further shown, the common source/drain nodes of the transistors MSW are coupled to ground via resistors RDS in a biasing arrangement. In one example, embodiment resistors RDS may be about 400 kΩ. Other values, however, may be used. The switch circuit of RF switch 102 may be implemented using FET transistors in a CMOS-Bulk, CMOS-SOI using thin or thick film silicon on insulator (SOI), GaAs-HEMTs, or other FET transistor type technology. In some cases, diodes having an undoped intrinsic semiconductor region between a P-type semiconductor and an N-type semiconductor region (PIN diodes) may also be used. As shown in FIG. 1B, transistor MSW is implemented using an NMOS device. Transistor MSW, however, may be implemented using a PMOS device, or other transistor type. The above description of an exemplary RF switch and an exemplary RF switch system can also be applied in its entirety to embodiments of the present invention.

During operation, driver 126 provides a negative voltage to the gates of transistors MSW within RF switch 102 in order to isolate node In1 from ground by turning transistors MSW off. To provide a conductive path from node In1 to ground, a positive voltage is applied to the gates of transistors MSW within switch 102 in order to turn on transistors MSW. In some embodiments, additional DC blocking capacitors (not shown in FIG. 1B), may be coupled to input node In1 to ensure a symmetric RF swing. Such DC blocking capacitors are utilized, for example, when a DC voltage is present on the RF line. In some embodiments where there is no DC voltage on the RF line, DC blocking capacitors are not used. For RF switches that do not have a negative bias on the MOS transistors, DC blocking is typically used. Such situations may occur, for example, in systems in which the gate of a transistor is switched between a positive voltage and ground, as is commonly the case with circuits implemented using GaAs HEMT switch technologies. It should be further understood that the polarity of the activation and deactivation voltages may be different when other transistor types besides NMOS devices are used. For example, in embodiments that utilize PMOS devices, the activation voltage may be lower than the deactivation voltage.

Figure 2:
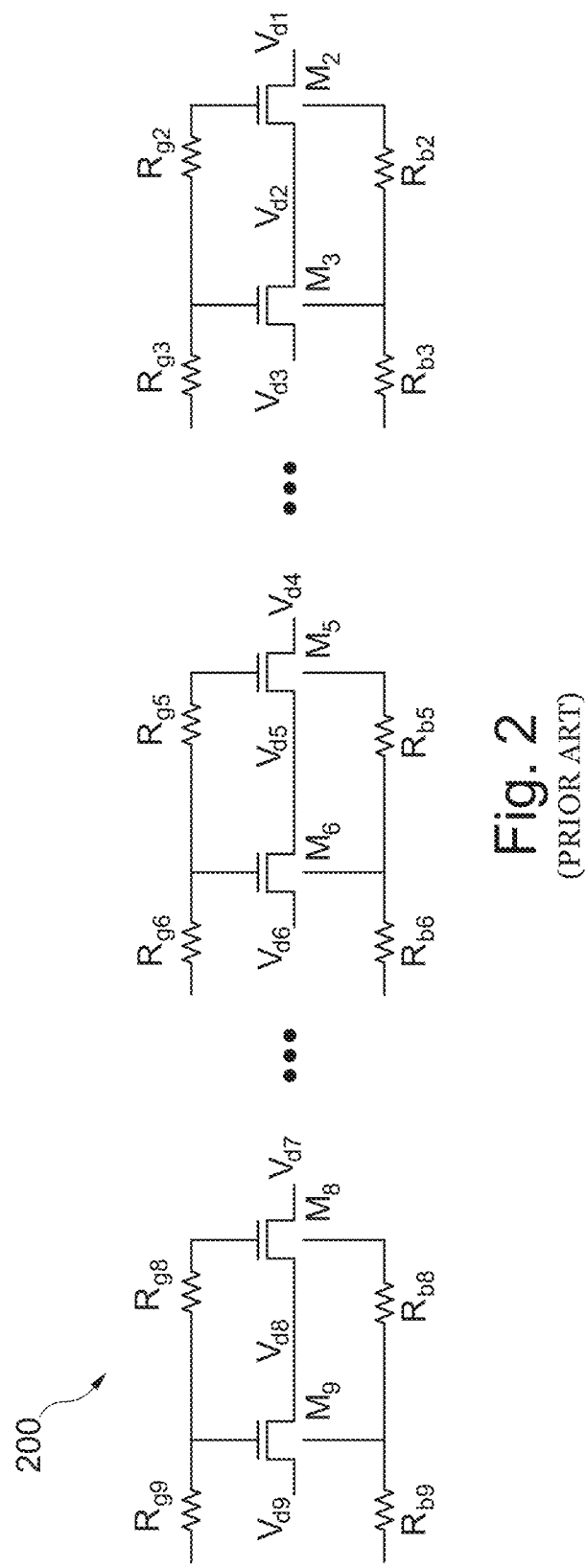
FIG. 2 illustrates a detailed view of a portion of an exemplary RF switch having an alternative biasing arrangement.

FIG. 2 illustrates a detailed view of a portion of an exemplary RF switch 200 having an alternative biasing arrangement. RF switch 200 includes a plurality of series connected transistors $M_2$, $M_3$, $M_5$, $M_6$, $M_8$, and $M_9$, which may be coupled between an RF source and ground, or between two RF sources, in embodiments. While six transistors are shown in FIG. 2, any number of transistors can be used. RF switch 200 also includes a corresponding plurality of series connected gate resistors $R_{g2}$, $R_{g3}$, $R_{g5}$, $R_{g6}$, $R_{g8}$, and $R_{g9}$, which may be coupled between a bias voltage source and ground, or between two bias voltage sources, in embodiments. Series connected gate resistors $R_{g2}$, $R_{g3}$, $R_{g5}$, $R_{g6}$, $R_{g8}$, and $R_{g9}$, are coupled to the gate nodes of transistors $M_2$, $M_3$, $M_5$, $M_6$, $M_8$, and $M_9$. RF switch 200 also includes a corresponding plurality of series connected body resistors $R_{b2}$, $R_{b3}$, $R_{b5}$, $R_{b6}$, $R_{b8}$, and $R_{b9}$, which may be coupled between a bias voltage source and ground, or between two bias voltage sources, in embodiments. Series connected body resistors $R_{b2}$, $R_{b3}$, $R_{b5}$, $R_{b6}$, $R_{b8}$, and $R_{b9}$, are coupled to the body nodes of transistors $M_2$, $M_3$, $M_5$, $M_6$, $M_8$, and $M_9$. The combination of a transistor, a body resistor, and a gate resistor as shown in FIG. 2 may also be referred to as an "RF cell" or "RF switch cell."

In order to equalize the voltage drop amongst the serially-connected transistors of RF switch 200 various ballasting techniques can be used. One possible implementation of a ballasting technique comprises varying (i.e. gradually increasing) the $C_{off}$ capacitance of each stacked transistor. The $C_{off}$ capacitance is defined as the parasitic capacitance coupled between the source node and the drain node of a transistor, when the transistor is in the OFF mode of operation. Correspondingly, the $R_{off}$ resistance is defined as the parasitic resistance coupled between the source node and the drain node of a transistor, when the transistor is in the OFF mode of operation. Lumped element equivalent circuits of a transistor in the OFF mode of operation typically include a Coff capacitor in series with an Roff resistor coupled between the source and drain nodes of the transistor. The $C_{off}$ capacitance of a transistor can be increased, for example, by adding an extra capacitance (not shown in FIG. 2) between the input and output node (source and drain nodes) of the transistor comprising a Metal-Insulator-Metal capacitor (MIM-Cap) or Metal-Oxide-Semiconductor capacitor (MOS-Cap).

In order to achieve an ideal equal voltage distribution across the series connected transistors, the extra capacitance can be selected according to the following equation:

$$C_{ballast}(n) = \frac{n(n-1)}{2} C_{sub},$$

wherein "n" represents the position of one transistor in the stacked chain of transistors, $C_{sub}$ represents the substrate capacitance of each transistor, and $C_{ballast}(n)$ is the extra ballasting capacitor. Alternatively, the ballast capacitance can be placed between one gate and the next gate of the transistor chains.

Using ballasting capacitors in the manner described above advantageously equalizes the voltage drop across each transistor of RF switch 200, but may cause RF switch 200 to become asymmetrical not only with respect to the size of the ballast capacitances, but also with respect to an applied RF voltage or RF power source. In other words, the RF switch is properly ballasted only in one direction with the RF power source at a first end of the switch and a ground connection at a second end of the switch. Reversing the RF switch between the RF power source and the ground connection will cause the RF switch to become improperly ballasted resulting in a loss of performance. Correspondingly, the use of the extra ballasting capacitors may therefore define a proper direction in which the switch can be operated. By operating RF switch 200 in the opposite direction the calculated harmonic voltage (VHC) distortion is increased since the unbalance of voltage drop across the transistors is RF switch 200 is even further accentuated. Using gradually increasing ballasting capacitors may also affect overall switch isolation by increasing the total $C_{off}$ of RF switch 200. As a consequence, the Figure of Merit (FOM) of RF switch 200 (FOM=$R_{on}*C_{off}$) may also increase.

In order to more effectively equalize the voltage across each transistor in RF switch 200, capacitive ballasting using embodiment varactor equalization circuitry is implemented and described in detail below. The capacitive ballasting according to embodiments equalizes the voltage across each of the transistors in the RF switch used. A varactor equalization circuit is coupled to at least one of a gate node and a body node of an RF cell, and is also coupled to at least one node in an adjacent RF cell. In embodiments, the DC voltage difference between the gate and the body of an RF cell activates at least one varactor in the varactor equalization circuit and therefore, the ballasting. The DC voltage difference can be set a-priori (e.g. Vb=−3V and Vg=−2.5V) or is a function of the RF power fed at the hot side of the switch. In this second case, leakage current or leakage compensation current flowing in the body resistor chain can change the DC potential and will therefore activate the varactor in the varactor equalization circuit.

In embodiments, the capacitive ballasting using the varactor equalization circuit can be implemented symmetrically. However, depending on the direction in which the switch is operated only the correct ballasting circuitry (usually the ballasting circuitry closest to an RF source) is activated. Embodiments of the capacitive ballasting circuitry, methods of use, and corresponding RF switch layouts are described in detail below.

Figure 3:
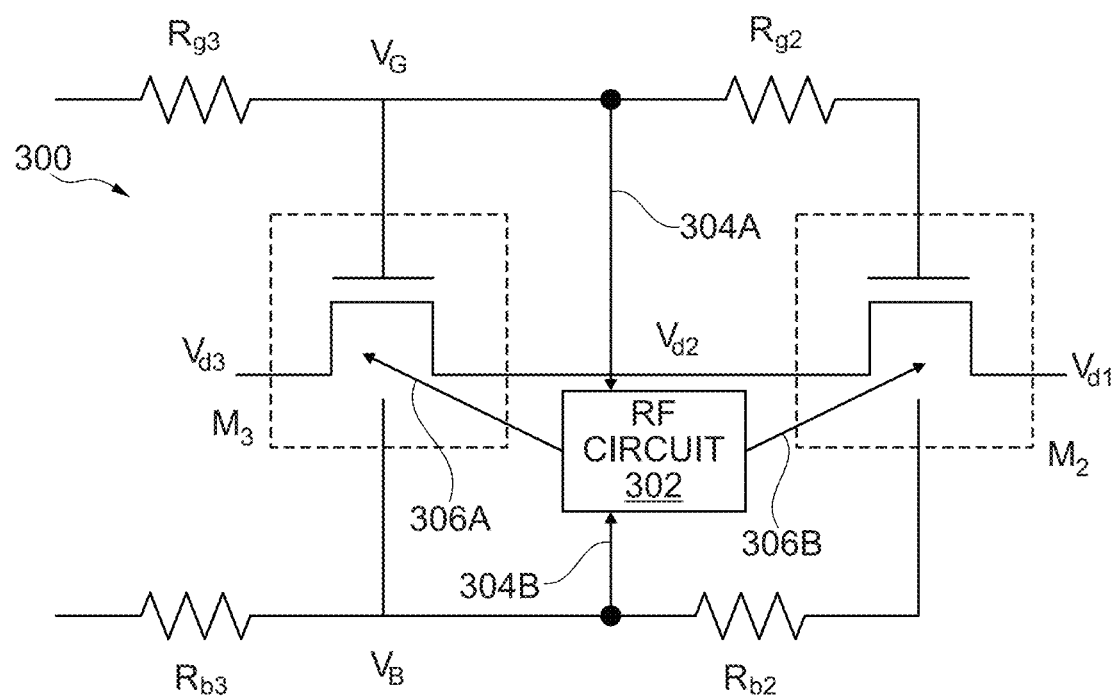
FIG. 3 illustrates a detailed view of a portion of an RF switch including an RF equalization circuit according to an embodiment.

FIG. 3 illustrates a detailed view of a portion of an RF switch 300 including an RF equalization circuit 302 according to an embodiment. The portion of RF switch 300 shown in FIG. 3 includes coupled transistors $M_2$ and $M_3$, gate resistors $R_{g2}$ and $R_{g3}$, and body resistors $R_{b2}$ and $R_{b3}$, as well as an RF equalization circuit 302 including at least one varactor. In FIG. 3 the source voltage of transistor $M_2$ is labeled $V_{d1}$ (which is also the drain voltage of a previous transistor), the drain voltage of transistor $M_2$ is labeled $V_{d2}$, and the drain voltage of transistor $M_3$ is labeled $V_{d3}$. The gate voltage of transistor $M_3$ is labeled $V_G$ and the body voltage of transistor $M_3$ is labeled $V_B$. The RF equalization circuit 302 includes one or more inputs 304A, 304B for receiving the $V_G$ voltage and/or $V_B$ voltage of transistor $M_3$. The RF equalization circuit 302 includes two or more outputs 306A, 306B for equalizing at least one voltage associated with transistor $M_3$ and at least one voltage associated with transistor $M_2$ in the OFF state of RF switch 300 once a varactor in RF equalization circuit 302 is activated.

While RF equalization circuit 302 is shown to have distinct inputs 304A, 304B and outputs 306A, 306B, in some embodiments the inputs and outputs may share a common node. For example, in FIG. RF equalization circuit 302 may receive an input voltage from the gate node of transistor $M_3$, but used to equalize the voltages on the gate node of transistor $M_3$ and the gate node of transistor $M_2$. In this case, the gate node of transistor $M_3$ will be a common node comprising both an input and an output of RF equalization circuit 302. As another example, RF equalization circuit 302 may receive an input voltage from the body node of transistor $M_3$, but used to equalize the voltages on the body node of transistor $M_3$ and the body node of transistor $M_2$. In this case, the body node of transistor $M_3$ will be a common node comprising both an input and an output of RF equalization circuit 302.

Figure 4A:
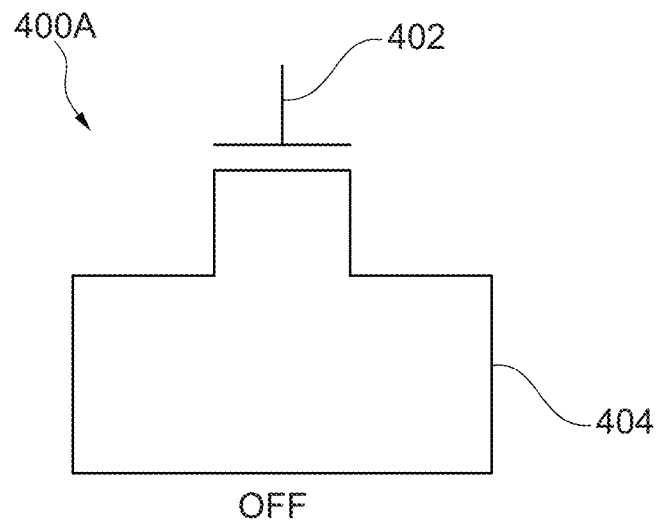
FIG. 4A illustrates a varactor in an OFF mode of operation.
Figure 4B:
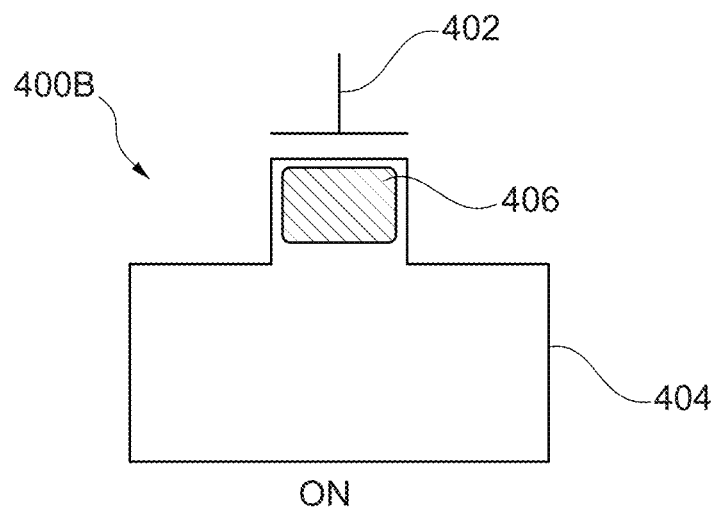
FIG. 4B illustrates a varactor in an ON mode of operation.

As previously described, RF equalization circuit 302 shown in FIG. 3 includes at least one varactor. As is known in the art, a varactor can comprise a transistor, a diode-connected transistor, or a diode having a capacitor that is activated in an ON mode of operation of the varactor. The activation of a varactor can be accomplished by a applying a DC or AC voltage across the varactor that traverses a threshold voltage between the ON and OFF modes of operation. In some embodiments a varactor can have a precise digital-type threshold voltage, whereas in other embodiments a varactor can have a transitional analog boundary region between the ON and OFF modes of operation. Thus the threshold voltage in these embodiments is not well defined. FIG. 4A illustrates a varactor 400A in an OFF mode of operation having a gate node 402 and a coupled source and drain node 404. Node 404 can also be referred to as the anode of varactor 404A and node 402 can also be referred to as the cathode of varactor 404A. Since varactor 404A is OFF, the varactor capacitance Cvar (not shown in FIG. 4A) is relatively low and on the order of 10 fF in an embodiment. A varactor 404B in the ON mode but otherwise has the same node connections as the OFF mode varactor 404A. The varactor capacitance Cvar 406 is relatively high and on the order of 1 pF in an embodiment. Cvar 406 is shown as a gate capacitance in FIG. 4B.

Figure 5A:
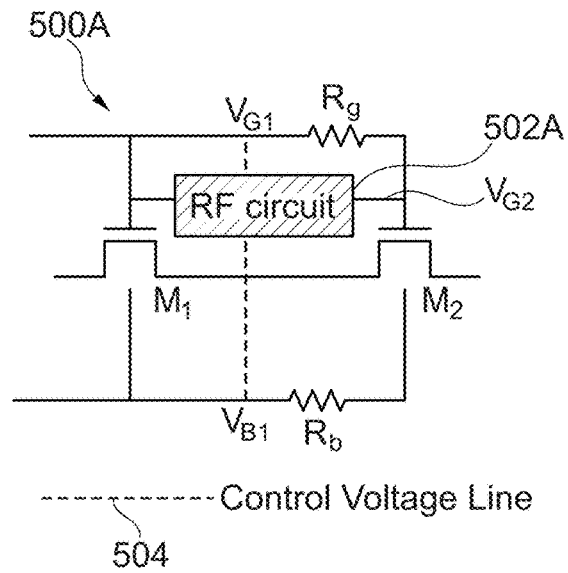
FIG. 5A is a schematic diagram of a portion of an RF switch including an RF equalization circuit coupled between gate nodes of adjacent RF cells according to an embodiment.
Figure 5B:
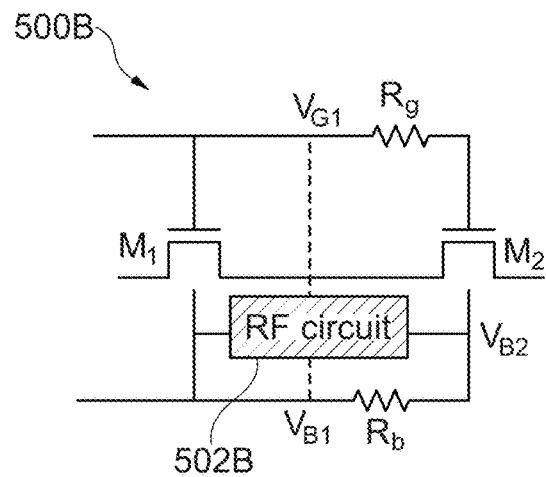
FIG. 5B is a schematic diagram of a portion of an RF switch including an RF equalization circuit coupled between body nodes of adjacent RF cells according to an embodiment.
Figure 5C:
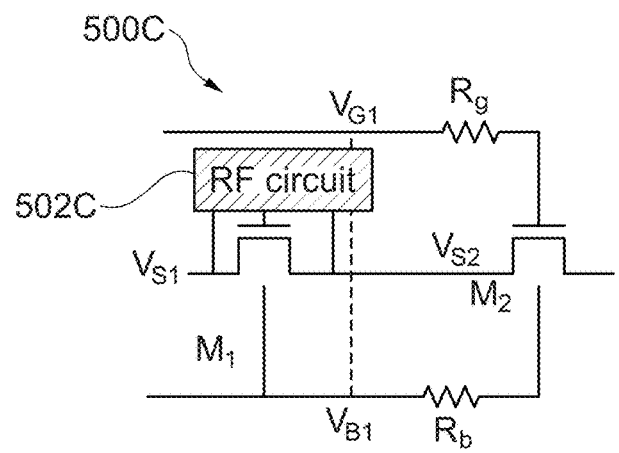
FIG. 5C is a schematic diagram of a portion of an RF switch including an RF equalization circuit coupled between source nodes of adjacent RF cells according to an embodiment.

FIGS. 5A, 5B, and 5C are schematic diagrams that illustrate the placement of corresponding RF equalization circuits 502A, 502B, and 502C within an RF switch according to embodiments of the invention. Each of RF equalization circuits 502A, 502B, and 502C use the voltage difference between a gate node and the body node of a transistor to activate or deactivate the RF equalization circuit within the RF switch chain. In turn, each of RF equalization circuits 502A, 502B, and 502C equalize a voltage associated with a first RF switch transistor to a voltage associated with a second RF switch transistor adjacent to the first RF switch transistor. In embodiments, the RF equalization circuit can be used to equalize the gate voltage of adjacent switch transistors, the body voltage of adjacent switch transistors, the source voltage of adjacent switch transistors, or the drain voltage of adjacent transistors. The RF equalization circuits can be configured to directly couple corresponding nodes of adjacent transistors, or can be configured to cross-couple different nodes of adjacent transistors. The voltage difference sensed by the RF equalization circuit can be achieved in an a priori fashion with predetermined internal threshold voltages, with a charging effect of leakage currents within the RF switch (such as Gate Induced Drain Leakage "GIDL" current), or with leakage compensation currents. Many other techniques for equalizing the voltage in adjacent RF switch cells and for activating the RF equalization circuits can be used.

FIG. 5A is a schematic diagram of a portion of an RF switch 500A including an RF equalization circuit 502A coupled between gate nodes of adjacent RF cells according to an embodiment. RF switch 500A includes serially-connected transistors $M_1$ and $M_2$. The gate voltage of transistor $M_1$ is labeled $V_{G1}$, and the body voltage of transistor $M_1$ is labeled $V_{B1}$. The gate nodes of transistor $M_1$ and adjacent transistor $M_2$ are coupled together via gate bias resistor $R_g$. The body nodes of transistor $M_1$ and adjacent transistor are coupled together via body bias resistor $R_b$. The voltage difference between the gate voltage and the body voltage of transistor $M_1$ ($V_{G1}-V_{B1}$) is sensed by RF equalization circuit 502A through control voltage lines 504. The gate node of transistor $M_1$ is coupled to a first output of RF equalization circuit 502A, and the gate node of adjacent transistor $M_2$ is coupled to a second output of RF equalization circuit 502A.

In an ON mode of switch 500A the RF equalization circuit 502A is deactivated. In an OFF mode of switch 500A the RF equalization circuit 502A is activated to equalize gate node voltages $V_{G1}$ and $V_{G2}$. The mechanism by which the RF equalization circuit 502A is activated is described in further detail below.

FIG. 5B is a schematic diagram of a portion of an RF switch 500B including an RF equalization circuit 502B coupled between body nodes of adjacent RF cells according to an embodiment. The components and connections of RF switch 500B are substantially the same as that of RF switch 500A shown in FIG. 5A, except for the output connections of RF equalization 502B. In pertinent part, the body node of transistor $M_1$ is coupled to a first output of RF equalization circuit 502B, and the body node of adjacent transistor $M_2$ is coupled to a second output of RF equalization circuit 502B.

In an ON mode of switch 500B the RF equalization circuit 502B is deactivated. In an OFF mode of switch 500B the RF equalization circuit 502A is activated to equalize body node voltages $V_{B1}$ and $V_{B2}$. The mechanism by which the RF equalization circuit 502B is activated is described in further detail below.

FIG. 5C is a schematic diagram of a portion of an RF switch 500C including an RF equalization circuit 502C coupled between source nodes of adjacent RF cells according to an embodiment. The components and connections of RF switch 500C are substantially the same as that of RF switch 500A shown in FIG. 5A, except for the output connections of RF equalization 502C. In pertinent part, the source node of transistor $M_1$ is coupled to a first output of RF equalization circuit 502C, and the source node of adjacent transistor $M_2$ is coupled to a second output of RF equalization circuit 502C. In an alternative embodiment, the drain node of transistor $M_1$ can be coupled to a first output of RF equalization circuit 502C, and the drain node of adjacent transistor $M_2$ can be coupled to a second output of RF equalization circuit 502C.

In an ON mode of switch 500C the RF equalization circuit 502C is deactivated. In an OFF mode of switch 500C the RF equalization circuit 502A is activated to equalize source node voltages $V_{S1}$ and $V_{S2}$. Alternatively, in an OFF mode of switch 500C the RF equalization circuit 502A is activated to equalize the drain node voltages of transistors $M_1$ and $M_2$. The mechanism by which the RF equalization circuit 502C is activated is described in further detail below.

Figure 6A:
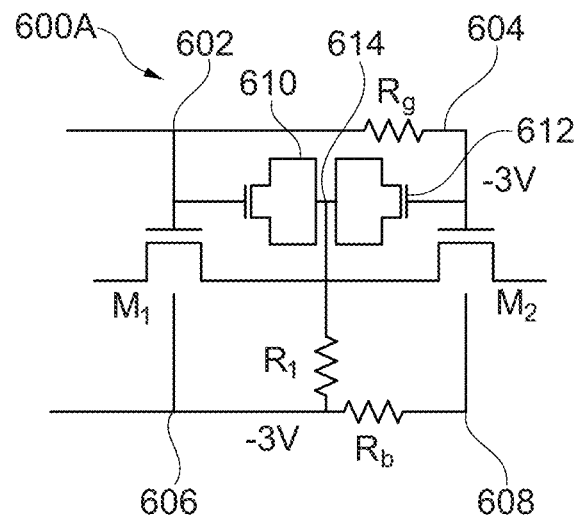
FIG. 6A is a schematic diagram of a portion of an RF switch including an inactivated RF equalization circuit according to an embodiment.
Figure 6B:
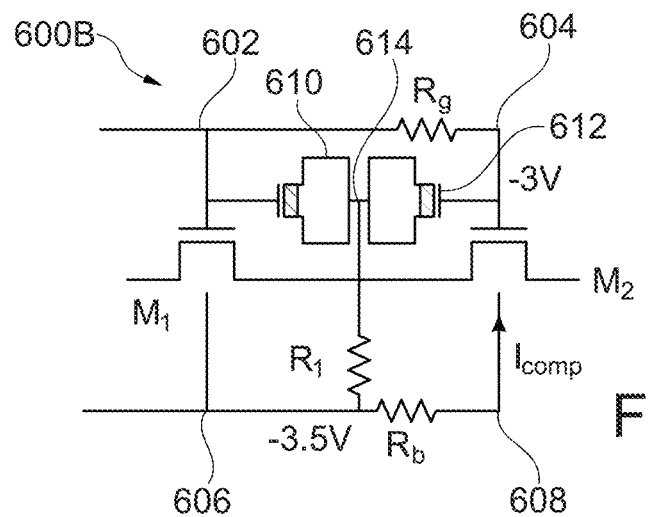
FIG. 6B is a schematic diagram of a portion of an RF switch including an RF equalization circuit activated by a leakage compensation current according to an embodiment.
Figure 6C:
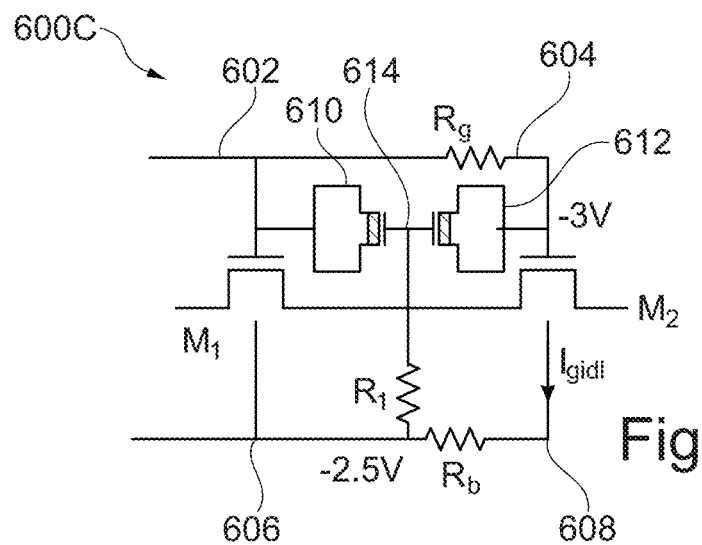
FIG. 6C is a schematic diagram of a portion of an RF switch including an RF equalization circuit activated by a leakage current according to an embodiment.

FIGS. 6A, 6B, and 6C include schematic diagrams that illustrate RF switch 500A of FIG. 5A in further detail. In FIGS. 6A, 6B, and 6C, RF switches 600A, 600B, and 600C are similar to RF switch 500A, including the same transistors $M_1$ and $M_2$, and the same gate and body bias resistors $R_g$ and $R_b$. However, the RF equalization circuits are replaced with a more detailed schematic of a component-level RF equalization circuit as will be explained below. In particular, FIG. 6A shows RF switch 600A in an ON mode of operation, FIG. 6B shows RF switch 600B in an OFF mode of operation including an externally generated leakage compensation current $I_{comp}$, and FIG. 6C shows RF switch 600C in an OFF mode of operation including an internally generated leakage current $I_{gidl}$.

In an embodiment, the RF equalization circuit can include a single capacitor coupled between the gate node of transistor M1 and the gate of node of adjacent transistor M2. In other embodiments, two capacitances can be implemented in the case of a bidirectional switch. In FIGS. 6A, 6B, and 6C the two capacitances are implemented as varactors 610 and 612. The gate nodes of varactors 610 and 612 are coupled to the gate node of transistor M1 and to the gate node of transistor M2. The coupled source and drain nodes of varactors 610 and 612 are coupled to internal node 614. Varactors 610 and 612 are switchable due to their connection to the body node of transistor M1 through resistor R1. By increasing the incident power (Pinc) to switches 600A, 600B, and 600C, the voltage at the body node of transistor M1 changes while the voltage at the gate of transistors M1 and M2 is kept constant. As a consequence, varactors 610 and 612 will be turned on (a channel will be created) and the capacitance value of the varactors increases. Depending on the leakage current or leakage compensation current used to activate the varactors, they will be placed and connected differently as is explained in further detail below.

In FIGS. 6A, 6B, and 6C switches 600A, 600B and 600C are all in the OFF mode of operation, meaning that transistors M1 and M2 are in the OFF mode of operation. Equalization of the voltage across the transistors in an RF switch as described herein with respect to embodiments is relevant only to the OFF mode of switch operation, as in the ON mode of operation there is a low voltage drop across the RF switch and the problem of uneven voltage distribution does not occur.

In FIG. 6A, the incident power applied to the power switch 600A is $P_{inc}=0$ dBm. There is no leakage current or leakage compensation current in this instance, and both varactors 610 and 612 are OFF. The capacitance associated with the varactors 610 and 612 is minimal and equal only to the OFF transistor capacitance of the varactor, $C_{off}=C_{FET}$. The gate node voltage of varactors 610 and 612, and the body nodes of transistors $M_1$ and $M_2$ are all at the same voltage of −3V.

In FIG. 6B, the incident power applied to the power switch 600A is Pinc=200 dBm. There is an internally or externally generated (with respect to the power switch) leakage compensation current Icomp in this instance, and both varactors 610 and 612 are ON. The capacitance associated with the varactors 610 and 612 is now increased, and equal to the OFF transistor capacitance of the varactor as well as the varactor capacitance, Coff=CFET+Cvar. The gate node voltage of varactors 610 and 612 are both at the same voltage of −3V, but the body nodes of transistors M1 is at a voltage of −3.5V due to the voltage drop caused by the leakage compensation current Icomp across body bias resistor Rb.

In FIG. 6C, the incident power applied to the power switch 600A is again Pinc=20 dBm. There is an internally generated leakage current Igidl in this instance, and both varactors 610 and 612 are ON. The capacitance associated with the varactors 610 and 612 is now increased, and equal to the OFF transistor capacitance of the varactor as well as the varactor capacitance, Coff=CFET+Cvar. The gate node voltage of varactors 610 and 612 are both at the same voltage of −3V, but the body nodes of transistor M1 is at a voltage of −2.5V due to the voltage drop caused by the leakage current Igidl across body bias resistor Rb. Note that the polarity of varactors 610 and 612 is changed in FIG. 6C, wherein the coupled source and drain nodes of the varactors are coupled to the gate nodes of transistors M1 and M2, and the gate nodes of the varactors are coupled to the internal node 614.

Figure 7:
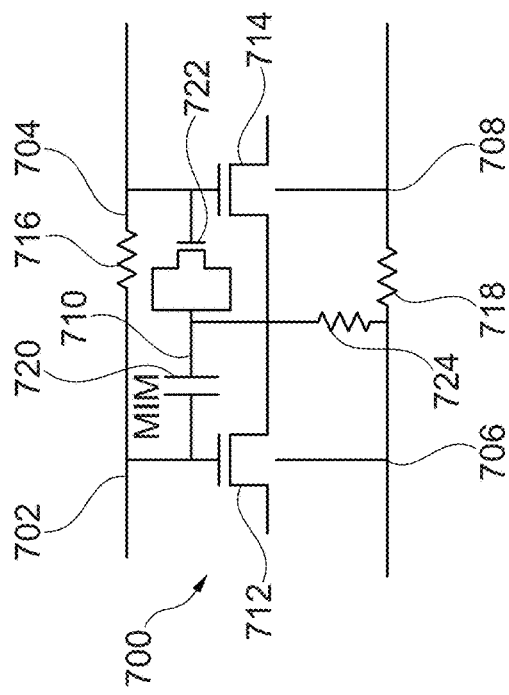
FIG. 7 is a schematic diagram of a portion of an RF switch including an RF equalization circuit having a Metal-Insulator-Metal (MIM) capacitor according to an embodiment.

FIG. 7 is a schematic diagram of a portion of an RF switch 700 including an RF equalization circuit having a Metal-Insulator-Metal (MIM) capacitor 720 according to an embodiment. RF switch 700 includes a first transistor 712, a second transistor 714, a gate bias resistor 716 coupled between the gate nodes of first transistor 712 and second transistor 714, and a body bias resistor 718 coupled between the body nodes of first transistor 712 and second transistor 714. The RF equalization circuit includes MIM capacitor coupled between the gate node of transistor 712 and internal node 710, a varactor 722 having a source/drain node coupled to the gate node of transistor 714 and a gate node coupled to internal node 710, and a resistor 724 coupled between internal node 710 and the body node of transistor 712. The RF equalization circuit shown in FIG. 7 is configured to be activated by an internally or externally generated leakage compensation current, and is configured to equalize the voltage at the gate node of transistor 712 and the voltage at the gate node of transistor 714.

Figure 8:
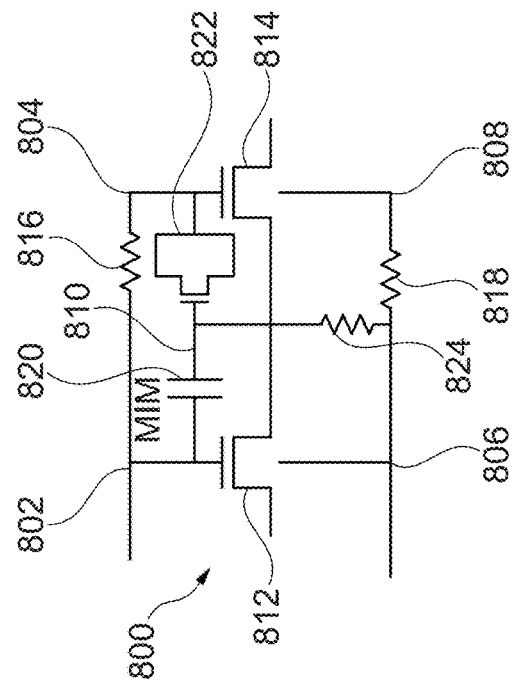
FIG. 8 is a schematic diagram of a portion of an RF switch including an RF equalization circuit having a MIM capacitor according to an alternative embodiment.

FIG. 8 is a schematic diagram of a portion of an RF switch 800 including an RF equalization circuit having a Metal-Insulator-Metal (MIM) capacitor 820 according to an embodiment. RF switch 800 includes a first transistor 812, a second transistor 814, a gate bias resistor 816 coupled between the gate nodes of first transistor 812 and second transistor 814, and a body bias resistor 818 coupled between the body nodes of first transistor 812 and second transistor 814. The RF equalization circuit includes MIM capacitor coupled between the gate node of transistor 812 and internal node 810, a varactor 822 having a gate node coupled to the gate node of transistor 814 and a source/drain node coupled to internal node 810, and a resistor 824 coupled between internal node 810 and the body node of transistor 812. The RF equalization circuit shown in FIG. 8 is configured to be activated by an internally generated leakage current. The RF equalization circuit shown in FIG. 8 is configured to be activated by an externally generated leakage compensation current, and is configured to equalize the voltage at the gate node of transistor 812 and the voltage at the gate node of transistor 814.

Figure 9:
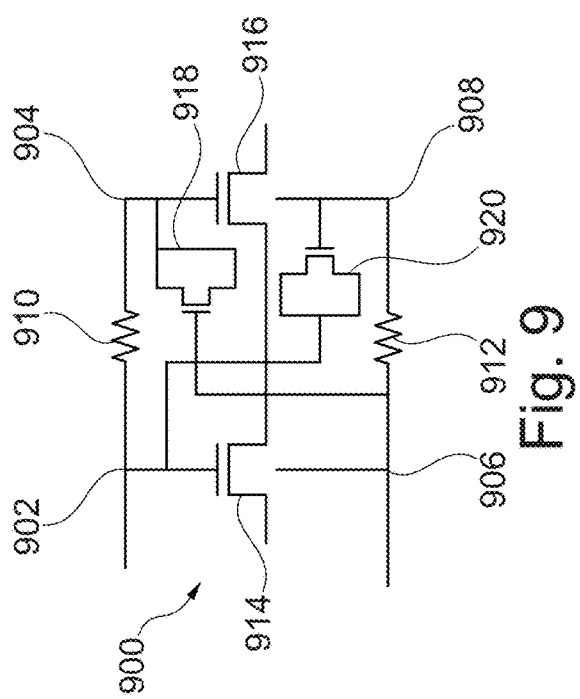
FIG. 9 is a schematic diagram of a portion of an RF switch including an RF equalization circuit having a cross-coupled configuration according to an embodiment.

FIG. 9 is a schematic diagram of a portion of an RF switch 900 including an RF equalization circuit having a cross-coupled configuration according to an embodiment. RF switch 900 includes a first transistor 914, a second transistor 916, a gate bias resistor 910 coupled between the gate nodes of first transistor 914 and second transistor 916, and a body bias resistor 912 coupled between the body nodes of first transistor 914 and second transistor 916. The RF equalization circuit includes a first varactor 918 having a gate node coupled to the body node of transistor 914 and a source/drain node coupled to the gate node of transistor 916. The RF equalization circuit also includes a second varactor 920 having a gate node coupled to the body node of transistor 916 and a source/drain node coupled to the gate node of transistor 914. The RF equalization circuit shown in FIG. 9 is configured to be activated by an internally generated leakage current, and is configured to equalize the voltage at the gate node of transistor 914 and the voltage at the body node of transistor 916 and to equalize the voltage at the gate node of transistor 916 and the voltage at the body node of transistor 914.

Figure 10:
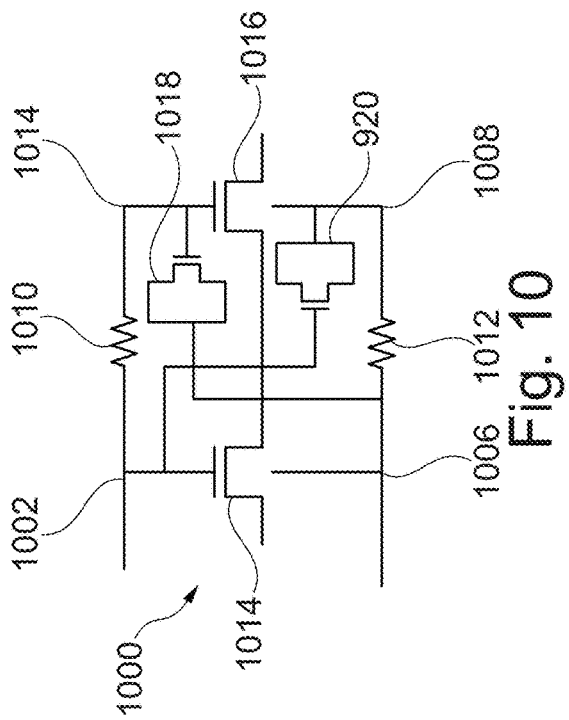
FIG. 10 is a schematic diagram of a portion of an RF switch including an RF equalization circuit having a cross-coupled configuration according to an alternative embodiment.

FIG. 10 is a schematic diagram of a portion of an RF switch moo including an RF equalization circuit having a cross-coupled configuration according to an embodiment. RF switch 1000 includes a first transistor 1014, a second transistor 1016, a gate bias resistor 1010 coupled between the gate nodes of first transistor 1014 and second transistor 1016, and a body bias resistor 1012 coupled between the body nodes of first transistor 1014 and second transistor 1016. The RF equalization circuit includes a first varactor 118 having a source/drain node coupled to the body node of transistor 1014 and a gate node coupled to the gate node of transistor 1016. The RF equalization circuit also includes a second varactor 1020 having a source/drain node coupled to the body node of transistor 1016 and a gate node coupled to the gate node of transistor 1014. The RF equalization circuit shown in FIG. 10 is configured to be activated by an internally or externally generated leakage compensation current, and is configured to equalize the voltage at the gate node of transistor 1014 and the voltage at the body node of transistor 1016 and to equalize the voltage at the gate node of transistor 1016 and the voltage at the body node of transistor 1014.

Figure 11:
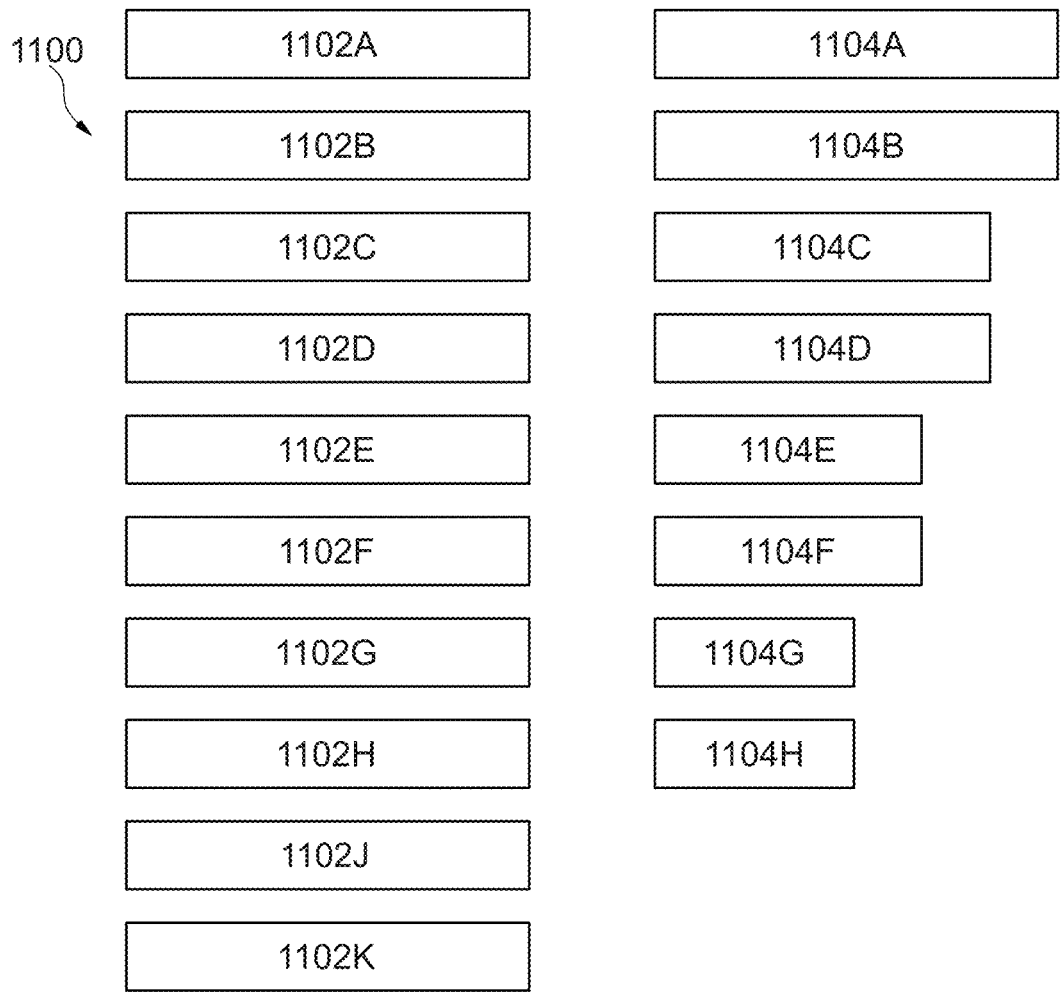
FIG. 11 is a plan view of a single-sided weighted RF switch layout according to an embodiment.

FIG. 11 is a plan view of a single-sided weighted RF switch layout 1100 according to an embodiment. RF switch layout 1100 includes a plurality of substantially equal-sized RF switch cells 1102A, 1102B, 1102C, 1102D, 1102E, 1102F, 1102G, 1102H, 1102J, and 1102K, each including an RF transistor and biasing resistors, but does not include the equalization circuit. RF switch layout 1100 includes a plurality of weighted RF equalization circuits 1104A, 1104B, 1104C, 1104D, 1104E, 1104F, 1104G, and 1104H, each including the equalization circuit components, most notably the varactors previously described. RF equalization circuits 1104A and 1104B have the largest layout area corresponding to the largest varactors in the equalization circuits. RF equalization circuits are placed closest to the RF source since the voltage difference between RF cells 1102A and 1102B is the greatest in this location of the RF switch. RF equalization circuits 1104C and 1104D have a slightly smaller area than RF equalization circuits 1104A and 1104B since the voltage difference between RF switch cells 1102C and 1102D is slightly less in this location of the RF switch. RF equalization circuits 1104G and 1104H have the smallest area since the voltage difference between RF switch cells 1102G and 1102H is even smaller in this location of the RF switch. Note that RF switch cells 1102J and 1102K have no corresponding RF equalization circuits since the voltage difference between these two RF switch cells is not great enough to justify the use of an RF equalization circuit. The RF equalization circuit layout shown in FIG. 11 is but one example. The area of the RF equalization circuits can be made to be linear, or to follow another descending mathematical function. While some of RF equalization circuits have been omitted, each RF switch cell can have a corresponding RF equalization circuit if desired. Other patterns of omitted RF equalization circuits can also be used in embodiments. RF switch layout 1100 is directional and is configured for an RF source being closest to RF switch cell 1102A and a ground connection being closest to RF switch cell 1102K. The directionality of RF switch layout 1100 means that using the RF switch in the opposite direction will result in a loss of switch performance. A symmetrical double-sided weighted RF switch layout is shown in FIG. 12 and is described below.

Figure 12:
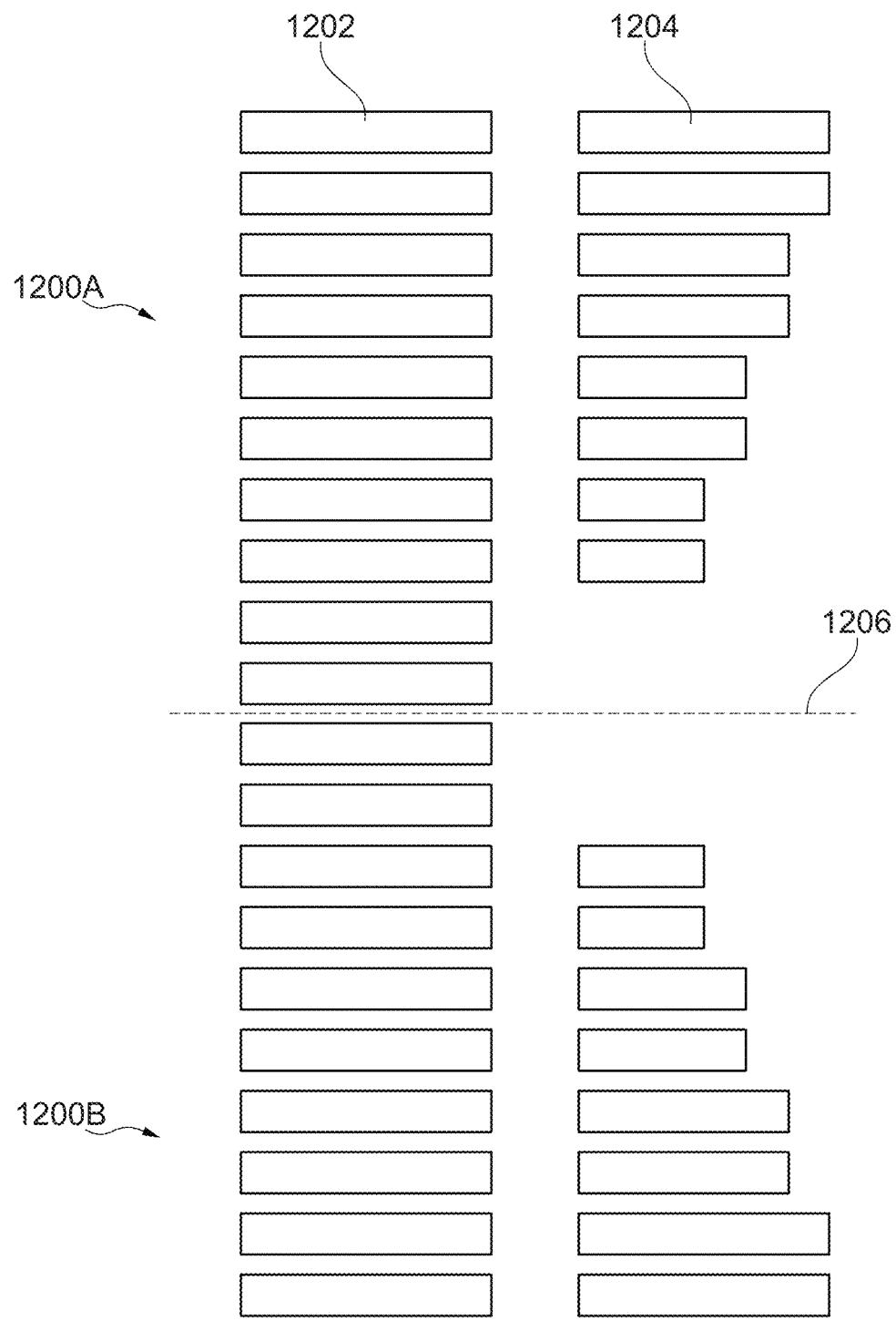
FIG. 12 is a plan view of a symmetrical double-sided weighted RF switch layout according to an embodiment.

FIG. 12 is a plan view of a symmetrical double-sided weighted RF switch layout according to an embodiment. The RF switch layout shown in FIG. 12 includes symmetrical portions 1200A and 1200B that are symmetrical about a horizontal symmetry axis 1206; an RF switch using this layout can be used bi-directionally between an RF source and ground, or between a first RF source and a second RF source. RF switch layout portion 1200A includes a plurality of equal-sized RF switch cells 1202, and a plurality of RF equalization circuits 1204 having a decreasing area from a maximum area closest to the top of the switch layout and a minimum area closest to the horizontal symmetry axis 1206. RF switch layout portion 1200B includes a plurality of equal-sized RF switch cells 1202, and a plurality of RF equalization circuits 1204 having an increasing area from a minimum area closest to the horizontal symmetry axis 1206 a maximum area closest to the bottom of the switch layout.

In operation, an RF switch using the layout of FIG. 12 is bidirectional and can be used in either direction between an RF source and ground, or between two RF sources. In the first case, layout portion 1200A will provide most of the equalization function and all of the RF equalization circuits will be used to help equalize the voltage between each of the RF switch cells 1202, in an embodiment. In the first case, layout portion 1200B may not be needed to provide the equalization function and most or all of the RF equalization circuit will be inactive. In the second case, both layout portions 1200A and 1200B will both be used to provide an equalization function to equalize the voltages between adjacent RF switch cells 1202.

Figure 13:
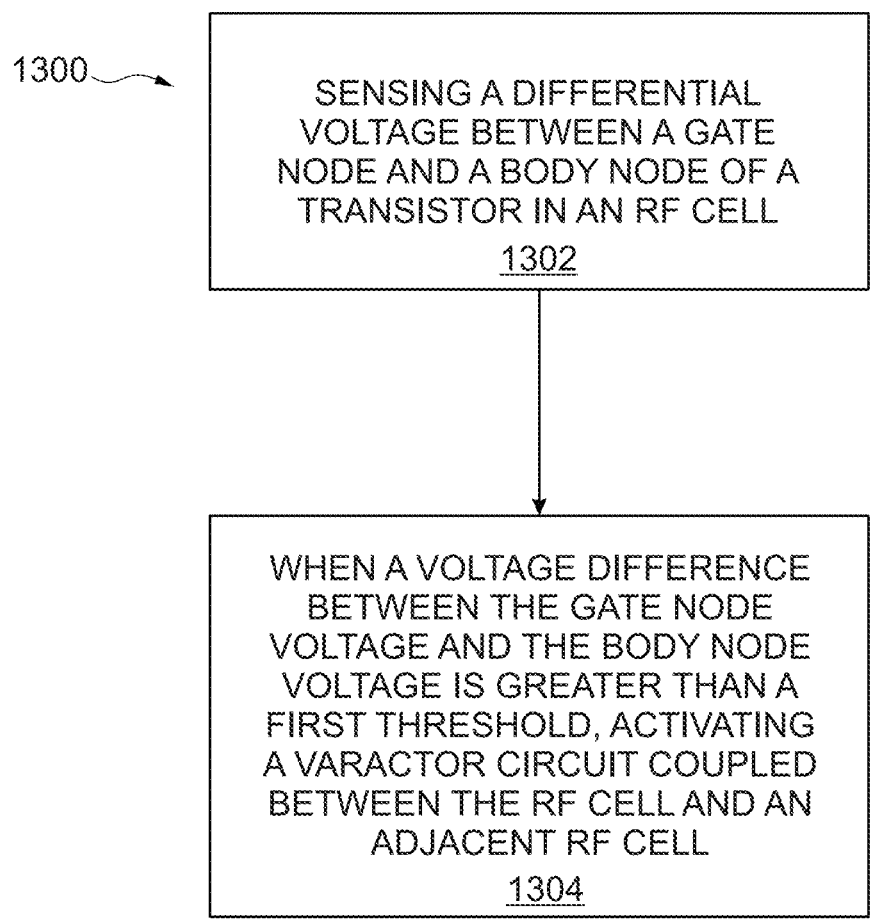
FIG. 13 is a flow chart of a voltage equalization method for an RF switch according to an embodiment.

A method 1300 of operating an RF switch comprising a plurality of serially coupled RF cells is shown in FIG. 13, according to an embodiment. The method comprises sensing a differential voltage between a gate node and a body node of a transistor in an RF cell in step 1302, and when a voltage difference between the gate node voltage and the body node voltage is greater than a first threshold, activating a varactor circuit coupled between the RF cell and an adjacent RF cell in step 1304.

Embodiments of the invention described above offer several advantages when compared to prior art solutions.

Embodiments of an RF switch using the RF equalization circuits according to embodiment can be operated in both directions with a high voltage RF source, and the voltage handling capability of the RF switch is therefore not directionally dependent.

The triggering of the capacitive ballasting according to embodiments can be set when a certain voltage peak has been reached. When operating at low voltages the OFF capacitance of the RF switch, $C_{off}$, is heavily reduced compared to the case with activated capacitive ballasting.

The varactor ballasting described above does not require extra biasing circuits as in some prior art ballasting circuits. The OFF resistance of the RF switch, $R_{OFF}$, therefore, will be advantageously higher. In addition, the implementation of the ballasting circuit according to embodiments is easier from a design and layout perspective.

Example embodiments of the present invention are summarized here. Other embodiments can also be understood from the entirety of the specification and the claims filed herein.

Example 1. According to an embodiment, an RF switch includes a plurality of serially coupled RF cells coupled between a first switch node and a second switch node, wherein each of the serially coupled RF cells comprise at least one transistor; and a varactor circuit coupled to a at least one node of a transistor in an RF cell, and coupled between the RF cell and an adjacent RF cell, wherein the varactor circuit is configured for equalizing a voltage of the RF cell and a voltage of the adjacent RF cell during an off mode of the RF switch.

Example 2. The RF switch of Example 1, wherein the at least one node comprises a body node of the transistor.

Example 3. The RF switch of any of the above examples, wherein the at least one node comprises a gate node of the transistor.

Example 4. The RF switch of any of the above examples, wherein the at least one node comprises a gate node and a body node of the transistor.

Example 5. The RF switch of any of the above examples, wherein the varactor circuit is configured to be activated when an applied RF switch signal exceeds a first amplitude.

Example 6. The RF switch of any of the above examples, wherein the varactor circuit is coupled between a gate node of the transistor in the RF cell and a gate node of a transistor in the adjacent RF cell.

Example 7. The RF switch of any of the above examples, wherein the varactor circuit is coupled between a body node of the transistor in the RF cell and a body node of a transistor in the adjacent RF cell.

Example 8. The RF switch of any of the above examples, wherein the varactor circuit is coupled between a source node of the transistor in the RF cell and a source node of the transistor in the adjacent RF cell, or wherein the varactor circuit is coupled between a drain node of the transistor in the RF cell and a drain node of the transistor in the adjacent RF cell.

Example 9. The RF switch of any of the above examples, wherein the varactor circuit is coupled between a gate node of the transistor in the RF cell and a body node of a transistor in the adjacent RF cell.

Example 10. The RF switch of any of the above examples, wherein the varactor circuit is coupled between a body node of the transistor in the RF cell and a gate node of a transistor in the adjacent RF cell.

Example 11. The RF switch of any of the above examples, wherein the varactor circuit comprises a first varactor coupled to an internal varactor circuit node, a second varactor coupled to the internal varactor circuit node, and a resistor coupled to the internal varactor circuit node.

Example 12. The RF switch of any of the above examples, wherein the varactor circuit comprises a varactor coupled to an internal varactor circuit node, a metal-insulator-metal (MIM) capacitor coupled to the internal varactor circuit node, and a resistor coupled to the internal varactor circuit node.

Example 13. The RF switch of any of the above examples, wherein the varactor circuit comprises a plurality of varactors.

Example 14. The RF switch of any of the above examples, wherein the adjacent RF cell comprises an immediately adjacent RF cell.

Example 15. The RF switch of any of the above examples, comprising N varactor circuits and N+1 serially coupled RF cells, wherein N is an integer greater than or equal to one.

Example 16. The RF switch of any of the above examples, comprising a plurality of varactor circuits fewer in number than the plurality of serially coupled RF cells.

Example 17. According to an embodiment, a method of operating an RF switch including a plurality of serially coupled RF cells includes sensing a differential voltage between a gate node and a body node of a transistor in an RF cell; and when a voltage difference between the gate node voltage and the body node voltage is greater than a first threshold, activating a varactor circuit coupled between the RF cell and an adjacent RF cell.

Example 18. The method of Example 17, wherein activating the varactor circuit comprises activating the varactor circuit during an off mode of operation of the RF switch.

Example 19. The method of any of the above examples, wherein the voltage difference between the gate node voltage and the body node voltage is greater than the first threshold when an applied RF switch voltage is greater than a first amplitude.

Example 20. The method of any of the above examples, further comprising equalizing a voltage of the RF cell and a voltage of the adjacent RF cell when the voltage difference between the gate node voltage and the body node voltage is greater than the first threshold.

Example 21. The method of any of the above examples, further comprising sensing a gate node voltage of each transistor in a subset of RF cells in the RF switch, and sensing a body node voltage of each transistor in a subset of RF cells in the RF switch.

Example 22. The method of any of the above examples, wherein the voltage difference between the gate node voltage and the body node voltage is caused by a leakage current of the RF switch.

Example 23. The method of any of the above examples, wherein the voltage difference between the gate node voltage and the body node voltage is caused by a leakage compensation current of the RF switch.

Example 24. According to an embodiment, an RF switch includes a first plurality of serially coupled RF cells coupled between a first switch node and a second switch node, wherein each of the serially coupled RF cells comprise at least one transistor; and a second plurality of varactor circuits, each varactor circuit of the second plurality of varactor circuits being coupled between corresponding adjacent RF cells of the first plurality of serially coupled RF cells, wherein each varactor circuit is coupled to a gate node and to a body node of one of the corresponding adjacent RF cells of the first plurality of serially coupled RF cells, wherein the second plurality of varactor circuits comprises weighted layout areas.

Example 25. The RF switch of Example 24, wherein each varactor circuit is configured for equalizing a voltage of the corresponding RF cells in an off mode of operation of the RF switch.

Example 26. The RF switch of any of the above examples, wherein the second plurality of varactor circuits is fewer in number than the first plurality of serially coupled RF cells.

Example 27. The RF switch of any of the above examples, wherein the second plurality of varactor circuits are arranged to have a maximum layout area varactor circuit closest to the first switch node.

Example 28. The RF switch of any of the above examples, wherein the second plurality of varactor circuits are arranged in a symmetrical layout with respect to the first and second switch nodes.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An RF switch comprising:
a plurality of serially coupled RF cells coupled between a first switch node and a second switch node, wherein each of the serially coupled RF cells comprise at least one transistor;
a varactor circuit coupled to at least one node of a transistor in an RF cell, and coupled between the RF cell and an adjacent RF cell, wherein the varactor circuit is configured for equalizing a voltage of the RF cell and a voltage of the adjacent RF cell during an off mode of the RF switch; and
at least one direct and continuous connection between a varactor in the varactor circuit and a gate of the transistor in the RF cell, wherein only a single varactor is coupled to the gate of the transistor in the RF cell.

2. The RF switch of claim 1, wherein the at least one node comprises a body node of the transistor.

3. The RF switch of claim 1, wherein the at least one node comprises a gate node of the transistor.

4. The RF switch of claim 1, wherein the at least one node comprises a gate node and a body node of the transistor.

5. The RF switch of claim 1, wherein the varactor circuit is configured to be activated when an applied RF switch signal exceeds a first amplitude.

6. The RF switch of claim 1, wherein the varactor circuit is coupled between a gate node of the transistor in the RF cell and a gate node of a transistor in the adjacent RF cell.

7. The RF switch of claim 1, wherein the varactor circuit is coupled between a body node of the transistor in the RF cell and a body node of a transistor in the adjacent RF cell.

8. The RF switch of claim 1, wherein the varactor circuit is coupled between a source node of the transistor in the RF cell and a source node of the transistor in the adjacent RF cell, or wherein the varactor circuit is coupled between a drain node of the transistor in the RF cell and a drain node of the transistor in the adjacent RF cell.

9. The RF switch of claim 1, wherein the varactor circuit is coupled between a gate node of the transistor in the RF cell and a body node of a transistor in the adjacent RF cell.

10. The RF switch of claim 1, wherein the varactor circuit is coupled between a body node of the transistor in the RF cell and a gate node of a transistor in the adjacent RF cell.

11. The RF switch of claim 1, wherein the varactor circuit comprises a first varactor coupled to an internal varactor circuit node, a second varactor coupled to the internal varactor circuit node, and a resistor coupled to the internal varactor circuit node.

12. The RF switch of claim 1, wherein the varactor circuit comprises a varactor coupled to an internal varactor circuit node, a metal-insulator-metal (MIM) capacitor coupled to the internal varactor circuit node, and a resistor coupled to the internal varactor circuit node.

13. The RF switch of claim 1, wherein the varactor circuit comprises a plurality of varactors.

14. The RF switch of claim 1, wherein the adjacent RF cell comprises an immediately adjacent RF cell.

15. The RF switch of claim 1, comprising N varactor circuits and N+1 serially coupled RF cells, wherein N is an integer greater than or equal to one.

16. The RF switch of claim 1, comprising a plurality of varactor circuits fewer in number than the plurality of serially coupled RF cells.

17. A method of operating an RF switch comprising a plurality of serially coupled RF cells, the method comprising:
sensing a differential voltage between a gate node and a body node of a transistor in an RF cell;
when a voltage difference between the gate node voltage and the body node voltage is greater than a first threshold, activating a varactor circuit coupled between the RF cell and an adjacent RF cell; and
directly and continuously connecting a varactor in the varactor circuit and a gate of a transistor in the RF cell, wherein only a single varactor is coupled to the gate of the transistor in the RF cell.

18. The method of claim 17, wherein activating the varactor circuit comprises activating the varactor circuit during an off mode of operation of the RF switch.

19. The method of claim 17, wherein the voltage difference between the gate node voltage and the body node voltage is greater than the first threshold when an applied RF switch voltage is greater than a first amplitude.

20. The method of claim 17, further comprising equalizing a voltage of the RF cell and a voltage of the adjacent RF cell when the voltage difference between the gate node voltage and the body node voltage is greater than the first threshold.

21. The method of claim 17, further comprising sensing a gate node voltage of each transistor in a subset of RF cells in the RF switch, and sensing a body node voltage of each transistor in a subset of RF cells in the RF switch.

22. The method of claim 17, wherein the voltage difference between the gate node voltage and the body node voltage is caused by a leakage current of the RF switch.

23. The method of claim 17, wherein the voltage difference between the gate node voltage and the body node voltage is caused by a leakage compensation current of the RF switch.

24. An RF switch comprising:
a first plurality of serially coupled RF cells coupled between a first switch node and a second switch node, wherein each of the serially coupled RF cells comprise at least one transistor; and
a second plurality of varactor circuits, each varactor circuit of the second plurality of varactor circuits being coupled between corresponding adjacent RF cells of the first plurality of serially coupled RF cells, wherein each varactor circuit is directly and continuously connected to a gate node and coupled to a body node of one of the corresponding adjacent RF cells of the first plurality of serially coupled RF cells, wherein only a single varactor is coupled to a gate of a transistor in each of the first plurality of RF cells, and
wherein the second plurality of varactor circuits comprises weighted layout areas.

25. The RF switch of claim 24, wherein each varactor circuit is configured for equalizing a voltage of the corresponding RF cells in an off mode of operation of the RF switch.

26. The RF switch of claim 24, wherein the second plurality of varactor circuits is fewer in number than the first plurality of serially coupled RF cells.

27. The RF switch of claim 24, wherein the second plurality of varactor circuits are arranged to have a maximum layout area varactor circuit closest to the first switch node.

28. The RF switch of claim 24, wherein the second plurality of varactor circuits are arranged in a symmetrical layout with respect to the first and second switch nodes.

* * * * *